United States Patent
Reichenbach et al.

(10) Patent No.: US 8,329,555 B2
(45) Date of Patent: Dec. 11, 2012

(54) METHOD FOR PRODUCING A CAPPING WAFER FOR A SENSOR

(75) Inventors: Frank Reichenbach, Wannweil (DE);
Franz Laermer, Weil der Stadt (DE);
Silvia Kronmueller, Schwaikheim (DE);
Andreas Scheurle, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 87 days.

(21) Appl. No.: 12/734,994

(22) PCT Filed: Oct. 20, 2008

(86) PCT No.: PCT/EP2008/064126
§ 371 (c)(1),
(2), (4) Date: Oct. 4, 2010

(87) PCT Pub. No.: WO2009/077234
PCT Pub. Date: Jun. 25, 2009

(65) Prior Publication Data
US 2011/0012248 A1    Jan. 20, 2011

(30) Foreign Application Priority Data
Dec. 17, 2007 (DE) ............... 10 2007 060 632

(51) Int. Cl.
*H01L 21/30* (2006.01)
*H01L 21/46* (2006.01)

(52) U.S. Cl. . 438/456; 438/106; 438/618; 257/E23.009; 257/680; 257/774

(58) Field of Classification Search ............ 257/E21.17, 257/E21.218, E21.506, E23.009, 680, 678, 257/434, 704, 773, 774; 205/122; 438/106, 438/116, 618, 686, 48, 50, 73, 75, 456, 455, 438/712; 361/772; 427/58; 472/58; 731/104
See application file for complete search history.

(56) References Cited

U.S. PATENT DOCUMENTS

| | | | |
|---|---|---|---|
| 5,424,245 A | 6/1995 | Gurtler et al. | |
| 5,448,014 A * | 9/1995 | Kong et al. | 174/539 |
| 6,225,692 B1 * | 5/2001 | Hinds | 257/698 |
| 6,342,406 B1 * | 1/2002 | Glenn et al. | 438/57 |
| 6,475,821 B2 * | 11/2002 | Honda | 438/48 |
| 6,534,340 B1 * | 3/2003 | Karpman et al. | 438/113 |
| 6,844,606 B2 * | 1/2005 | Logsdon et al. | 257/434 |
| 6,846,725 B2 * | 1/2005 | Nagarajan et al. | 438/456 |
| 7,109,068 B2 * | 9/2006 | Akram et al. | 438/128 |
| 7,176,106 B2 * | 2/2007 | Snyder et al. | 438/455 |
| 7,275,424 B2 * | 10/2007 | Felton et al. | 73/104 |
| 7,368,808 B2 * | 5/2008 | Heck et al. | 257/678 |
| 7,629,201 B2 * | 12/2009 | Gan et al. | 438/106 |
| 7,696,004 B2 * | 4/2010 | Yuan et al. | 438/106 |
| 7,859,586 B2 * | 12/2010 | Murata et al. | 348/335 |
| 7,897,503 B2 * | 3/2011 | Foster et al. | 438/618 |
| 2004/0077121 A1 * | 4/2004 | Maeda et al. | 438/75 |
| 2006/0211233 A1 | 9/2006 | Gan et al. | |
| 2006/0216856 A1 | 9/2006 | Zhao | |
| 2007/0290329 A1 * | 12/2007 | Murayama et al. | 257/704 |

FOREIGN PATENT DOCUMENTS

| | | |
|---|---|---|
| DE | 197 00 734 | 7/1998 |
| EP | 1 749 794 | 2/2007 |

\* cited by examiner

*Primary Examiner* — Chris Chu
(74) *Attorney, Agent, or Firm* — Kenyon & Kenyon LLP

(57) ABSTRACT

A method for producing a capping wafer for a sensor having at least one cap includes: production of a contacting via extending through the wafer, and, temporally subsequent thereto, filling of the contacting via with an electrically conductive material.

6 Claims, 6 Drawing Sheets

☐ Silicon, 50   ▧ Silicon oxide, 52

▨ copper (+Cr-, WTi- Bonding layer, or the like), 53

☐ Silicon, 50   ▧ Silicon oxide, 52   ▨ lacquer, 55

▨ copper (+Cr-, WTi- bonding layer or the like), 53

☐ silicon, 50　　▨ silicon oxide, 52　　▨ Gold or the like, 51
▨ copper (+Cr-, WTI- bonding layer or the like), 53

☐ Silicon, 50　　▨ Silicon oxide, 52　　▨ Gold or the like, 51　　▨ Sealing glass, 54

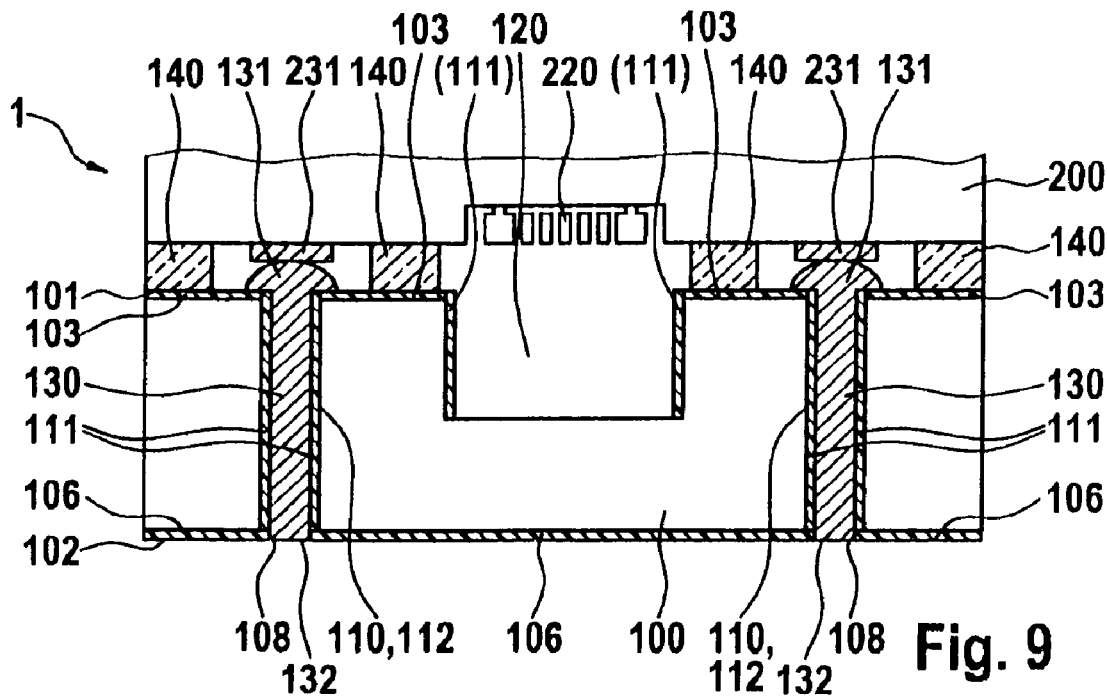
| □ silicon 50 | ▩ silicon oxide, 52 | ▨ Gold or the like, 51 | ▨ Sealing glass, 54 |
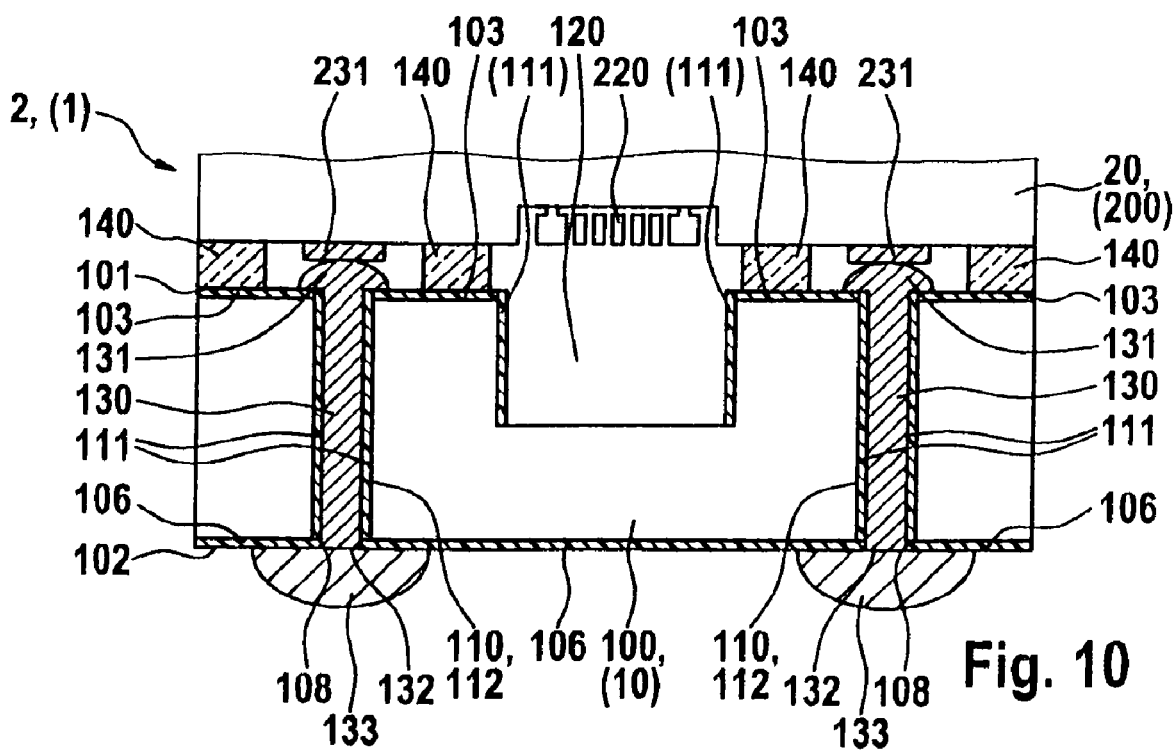
| □ Silicon, 50 | ▩ Silicon oxide, 52 | ▨ Gold or the like, 51 | ▨ Sealing glass, 54 |
| | | | ▨ solder, 56 |

METHOD FOR PRODUCING A CAPPING WAFER FOR A SENSOR

BACKGROUND OF THE INVENTION

1. Field of the Invention

The present invention relates to a method for producing a capping wafer for a sensor, in particular a sensor in a motor vehicle. In addition, the present invention relates to a method for producing a sensor stack, in particular an inertial sensor stack, having at least one sensor. In addition, the present invention relates to a capping wafer, to a sensor having a cap according to the present invention, and to a configuration of a substrate having a sensor according to the present invention.

2. Description of Related Art

A sensor, in particular a microelectromechanical sensor (MEMS sensor), in particular a capacitive inertial sensor for measuring accelerations and/or rates of rotation, is as a rule packaged in a plastic housing together with an IC chip that evaluates and pre-processes a raw sensor signal. Before installing the sensor in the plastic housing, a sensitive sensor structure is provided with a cap. This is necessary in order to protect movable sensor structures from subsequent processes, including for example gelation, and in order to permit the setting of a desired internal pressure and thus a desired sensor oscillation quality.

For this purpose, before the separation of a large number of (capacitive inertial) sensors, a so-called capping wafer is bonded onto an electrical sensor wafer using sealing glass bonds. This results in a so-called sensor stack that comprises the sensor wafer and the capping wafer fastened thereon, forming a large number of sensors bonded fixedly to one another. Here, the sealing glass is applied in the shape of a frame around caverns of the capping wafer using a screen printing method. The sealing glass (glass solder) ensures a hermetic seal between the capping wafer and the sensor wafer in the region of the caverns.

The job of the caverns is to keep small a relative change of an enclosed volume between the capping wafer and the sensor wafer when the sealing glass is pinched, and to act as a pressure or vacuum reservoir for the sensor, which will later be separated. The accesses to the electrical terminals (bonding pads) of each sensor are situated outside the frame, and in the capping wafer are already recessed in a suitable manner and thus made accessible. See here for example published German patent document DE 197 00 734 A1.

After the separation of the sensor stack, the individual sensors can be glued into the plastic housing. The electrical connections from the sensor to the IC chip and the electrical connections from the electrical terminals of the housing to the bonding pads of the IC chip are realized using bonding wires. Subsequently, the bonding layers are gelated and the plastic housing is sealed. Only then is the resulting sensor element ready to be soldered onto a circuit board. In sensors having a hybrid construction (two-chip solution having a sensor chip and an IC chip), such a procedure is required because the electrical connections, which are high-ohmic and are susceptible to disturbances, between the (capacitive) sensor and an evaluation electronics system must be realized in a defined manner, mechanically fixed, and protected.

U.S. Pat. No. 7 275 424 B2 discloses a manufacturing method for a sensor stack, as well as a sensor stack, or a manufacturing method for a capped sensor, as well as a sensor. Here, in a capping wafer caverns are provided, and outside a cavern electrically insulated vias are provided. Subsequently, the capping wafer is further processed, by a sealing glass bonding with a sensor wafer, to form a sensor stack, the sealing glass being applied onto the capping wafer using a screen printing method, and the sealing glass bond between the capping wafer and the sensor wafer being formed subsequently. After this, the vias of the sensor stack are filled with a doped polysilicon material or by chemical nickel-plating in such a wave that an electrical contacting results to aluminum contacts of the sensor wafer that are situated inside the sensor stack. Subsequently, an intermediate space situated between the capping wafer and the sensor wafer is filled with a polymer, an external side on the capping wafer of the sensor stack is provided with an electrical insulating layer, and subsequently an electrical outer contacting of the sensor stack to the outer insulating layer is provided. For this purpose, the insulating layer in the area of the internal electrical contacting is etched free to the inner aluminum contacts and is filled with a metal that extends up to the external side of the insulating layer, forming a plate. A solder bump is placed on each such plate in order to enable the sensors to be soldered onto a circuit board.

Here it is problematic that an electrical through-connection of the sensor stack is not set up until after bonding of the sensor wafer to the capping wafer. If a process of filling the vias is not successful, the entire sensor stack, or at least a part thereof, must be scrapped. Furthermore, in this method it is not possible to produce an individual capping wafer having a through-connection, so that such a method also cannot be outsourced to a supplier. In addition, it is not possible to fill the vias using an electroplating method, so that the selection of a material for the through-connection, and for a method of filling it, is limited.

BRIEF SUMMARY OF THE INVENTION

Therefore, an object of the present invention is to provide an improved method for producing a capping wafer and/or a sensor stack. In addition, an object of the present invention is to provide an improved capping wafer, an improved sensor, and a configuration of a sensor according to the present invention on a substrate. Here, it is intended to provide a sensor directly on a substrate without an additional housing, the sensor nonetheless being resistant to environmental influences. Here, a capping wafer of a sensor stack is intended to be capable of being produced completely separately. In addition, an electrical through-connection of the capping wafer is to be producible using an electroplating method. In addition, according to the present invention the reject rate during the production of a sensor is to be reduced.

A separate capping wafer according to the present invention has metallic through-connections from a front side to a rear side, these electrical through-connections raising the positions of the electrical sensor terminals to a level at which it is possible to produce a direct solder connection to a substrate, e.g. a circuit board, through flipping of a separated sensor. Here, an electrical contact pin of the through-connection has a direct electrical terminal for a separate sensor wafer. In addition, it is preferred that the electrical contact pin also has an electrical terminal for the substrate.

In preferred example embodiments of the present invention, the relevant electrical terminal of the through-connection essentially terminates flush with the front and/or rear side of the capping wafer, or has a projection at the front and/or rear side and stands away from the relevant side. Here, a respective electrical terminal can be a side contact that essentially sits planar with the relevant side, a stop contact, or a solder bump. In preferred specific embodiments of the present invention, the electrical through-connection of the capping wafer according to the present invention is produced by an electroplating method. Here it is possible to also form an electrical terminal using the electroplating method; this preferably holds for the electrical terminal that later electrically contacts a relevant electrical terminal of the sensor wafer. In this way, an electrical contact in the form of a press contact or pressure contact is obtained.

A sensor stack according to the present invention is preferably obtained in that the capping wafer according to the present invention is mechanically solidly bonded, with a material bond, to the sensor wafer by a sealing glass bond. Here, sealing glass is preferably applied onto the front side of the capping wafer at the relevant regions, preferably using a screen printing method, and the sensor stack is subsequently produced by pressing with the sensor wafer with application of heat. Here, the electrical through-connections of the capping wafer contact the relevant electrical terminals of the sensor wafer, which are preferably fashioned as bonding pads on the sensor wafer, it being preferred that the relevant electrical contacts of the capping wafer be fashioned as stop contacts produced using electroplating. According to the present invention, before or after the separation of the sensor stack, the sensor stack or the separated sensors are provided with solder bumps at the relevant electrical contacts on the rear side of the capping wafer.

The configuration according to the present invention includes a substrate, in particular a circuit board, and a sensor separated from the sensor stack, the sensor being provided directly on the circuit board, bonded mechanically solidly thereto and contacting it electrically. Here, an electrical contact of the sensor, in particular an electrical contact of a cap of the sensor, electrically contacts the substrate. In this way, it is possible to transport sensor signals from a sensor device of the sensor through the cap of the sensor to the substrate.

The electroplating required for the present invention in preferred specific embodiments is preferably a gold electroplating. However, according to the present invention it is possible to use some other electroplating or some other method. In addition, it is possible to use any electrically conductive material for the electrical through-connection.

The method according to the present invention for producing the capping wafer is characterized by the steps: production of contacting vias between the front and rear side of the capping wafer, and subsequent filling of the vias with an electrically conductive material. Here, as stated above, the electrically conductive material can be any electrically conductive material. Preferably, the vias are filled with an electroplating, preferably gold electroplating. In addition, here it is preferred that the electroplating method last long enough that at least on one side of the capping wafer, in the regions of the vias, the electrically conductive material stands out, resulting in an electrical stop contact that protrudes from the relevant side of the capping wafer.

In example embodiments of the present invention, an electrical insulating layer, in particular silicon oxide, is applied onto or incorporated into the rear side of a silicon wafer (capping wafer) temporally before the production of the vias. Subsequently, copper, with a bonding layer if warranted, is applied onto this electrical insulating layer. Parallel to the application/incorporation at the rear side of the electrical insulating layer, an electrical insulating layer, in particular silicon oxide, may also be applied or incorporated at the front side.

Subsequently, in example embodiments of the present invention a trench mask is formed on the front side of the capping wafer for the vias and for the caverns of the capping wafer. That is, the trench mask has corresponding openings for the vias and for the caverns. Subsequently, the cavern openings in the trench mask are covered by a lacquer mask. After this, a trenching method takes place by which the vias and the caverns inside the capping wafer are fashioned. Here, it is preferred that the caverns not be worked as far into the capping wafer as the vias.

In example embodiments of the present invention, first the vias are trenched on; i.e., blind holes are made in the capping wafer down to a certain depth. Subsequently, the lacquer mask is removed and the trenching process is continued. In this way, there result the vias that extend completely through the capping wafer, and the caverns also result. Here it is preferable for the trenching method to stop after the complete formation of the vias; i.e., the caverns are made exactly as deep in the capping wafer as are the vias in the second step of the trenching method. This also means that in the first step of the trenching method this method is carried out until a remaining thickness of the capping wafer between its electrical insulating layer and the trench floor of the resulting vias is exactly as large as a later depth of the caverns inside the capping wafer. However, it is also possible to etch the caverns down to a particular depth after the complete formation of the vias.

For later problem-free functioning of the caps, the vias of the capping wafer are electrically insulated on their respective inner walls. For this purpose, for example a side wall passivation can be deposited on the inside of the vias, this passivation also being fashioned inside the vias on the rear side of the capping wafer. That is, the passivation is also formed on the electrical insulating layer of the capping wafer inside the vias.

In order to enable the electroplating method to be started on the copper layer as a plating base inside the vias, the passivation deposited on the floor of the vias, as well as the electrical insulating layer on the rear side of the capping wafer in the region of the vias, must be removed. That is, the passivation, including the oxide on the rear side on the trench floor, is preferably anisotropically opened. This results in internally electrically insulated vias that pass completely through the capping wafer and that are closed at the end face (rear side) only by the rear-side copper layer of the capping wafer.

Electroplating is then used to fill the vias. The vias are filled beginning on the inside at the copper layer on the rear side of the capping wafer, growing in the direction of the front side. Here, the electroplating can be continued until the deposited material protrudes from the vias and forms there an electrical contact, preferably an electrical stop contact. Preferably, a stop contact is formed in the shape of a segment of a sphere, so that each electrical through-connection has a mushroom-shaped construction, seen from the side. For the electroplating method, all electrically conductive materials suitable for electroplating may be used; noble and semi-noble metals are preferred due to their very good electrical conductivity.

After the electroplating, the plating base or the copper layer is removed, and a capping wafer results that can be combined with a sensor wafer to form a sensor stack. For this purpose, the capping wafer and the sensor wafer are bonded with one another in a known manner. In preferred specific embodiments of the present invention, this takes place via a sealing glass bond between the capping wafer and the sensor wafer. For this purpose, the sealing glass is preferably applied onto the capping wafer using a screen printing mask. However, it is also possible to apply the sealing glass onto the sensor wafer. Here, sealing glass frames or lips form on the capping wafer or on the sensor wafer.

Subsequently, the capping wafer is bonded onto the sensor wafer, resulting in a sensor stack according to the present invention. The sensor stack can now be separated to form sensors, and each sensor can be provided with solder bumps on its rear side in the region of the electrical contacts resulting from the filled vias. According to the present invention, it is also possible before the separation of the sensor stack to provide the solder bumps in the region of the respective electrical rear-side contacts on the sensor stack, and only then to subsequently separate the sensor stack into sensors.

In example embodiments of the present invention, an electrical contacting of the sensor wafer and the capping wafer takes place immediately through electrical stop contacts, preferably fashioned as bonding pads, of the capping wafer, and through the electrical terminals of the sensor wafer that stand out from the filled vias. The electrical stop contacts sit directly on the electrical terminals of the sensor wafer and contact them electrically.

After the provision of the solder bumps on the sensor, or the separation of the sensor stack provided with solder bumps to form sensors, the sensor capped according to the present invention can be flipped on the substrate, e.g. the circuit board or a ceramic, and soldered directly onto the substrate.

According to the present invention, it is possible to solder a sensor, in particular a microelectromechanical sensor, onto a substrate, in particular a circuit board, as a "naked chip" without an additional (plastic) housing, the sensor nonetheless remaining resistant to environmental influences. The completely separate production method made possible by the present invention for a capping wafer according to the present invention has advantages from the point of view of production technique. In particular, the separate processing of the capping wafer achieves a higher yield. If a filling process of the vias is not successful, then according to the present invention only the cap or the capping wafer, and not the entire sensor or an entire sensor stack, has to be scrapped. In addition, the present invention makes it possible to provide an electrical, through-connection for the sensor or the capping wafer using an electroplating method.

In addition, according to the present invention it is possible to carry out the process of filling the vias, or the entire process of producing the capping wafer, in a separate line or foundry. Many manufacturers of microelectromechanical sensors and/or semiconductor production plants do not have electroplating facilities, and do not wish to acquire them due to concerns about contamination. If the electroplating method is carried out exclusively on the capping wafer, the production of the capping wafer can be outsourced unproblematically, because the relevant suppliers thereby gain information only about the capping wafer, and do not learn any further company secrets regarding the sensor and its manufacture.

BRIEF DESCRIPTION OF THE SEVERAL VIEWS OF THE DRAWING

FIGS. 8 through 10 show the sequential steps of a production method according to the present invention for a sensor stack.

DETAILED DESCRIPTION OF THE INVENTION

Figure 1:
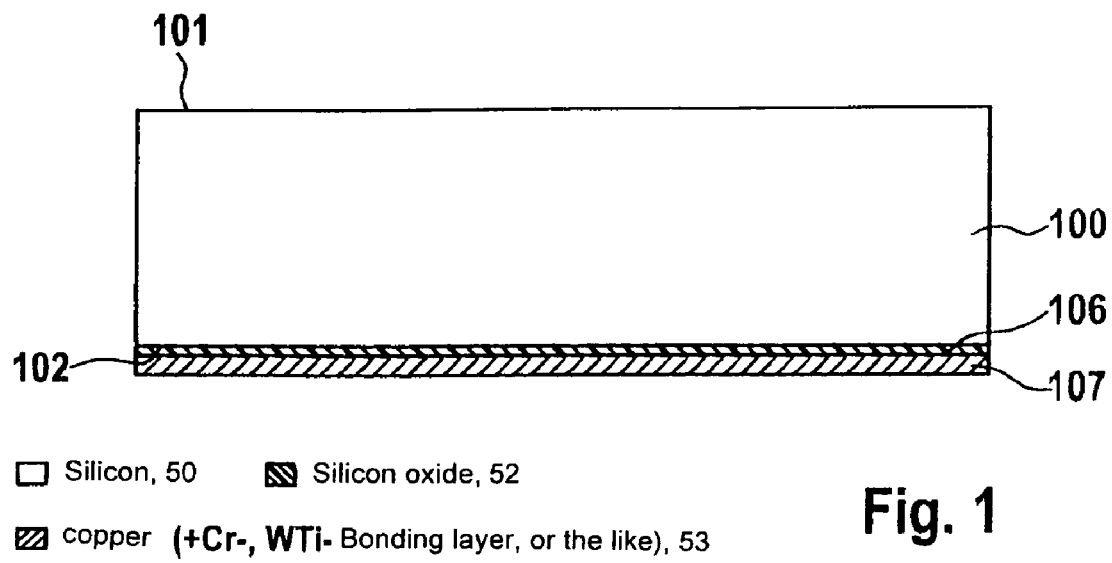
FIGS. 1 through 7 show the sequential steps of a production method according to the present invention for a capping wafer.

When in the following reference is made to a capping wafer or to a sensor wafer, in each case the individual part, i.e. a capping wafer or a sensor wafer in itself, is meant. If the two wafers are affixed to one another, this is no longer referred to as a wafer, but as a sensor stack. In addition, in a capping wafer at least one individual cap is fashioned, or the capping wafer has at least one individual cap. Analogously, in the sensor wafer there is fashioned at least one sensor element, or the sensor wafer has at least one individual sensor element.

According to the present invention, a sensor can be soldered onto a substrate as a "naked chip" that does not have an additional housing but is nonetheless insensitive to external influences. Preferred for this purpose is a monolithically integrated sensor having low-ohmic electrical connections to the exterior. In such a case, the high-ohmic electrical connections are already in themselves shielded by an integration of the sensor to such an extent that attention to this point is no longer required during the construction and connection design. The electrical inputs and outputs of a monolithically integrated sensor are electrically stable, are not susceptible to disturbance, and are loadable. A direct connection via the substrate to other electrical or electronic components is therefore easily possible. The omission of the housing according to the present invention not only enables cost savings, but also reduces the dimensions of the sensor and a thickness of the sensor chip, or a thickness of the substrate, by a significant amount. In addition to an encapsulation, such a monolithically integrated sensor includes a sensor device and an integrated circuit, fashioned for example as an application-specific integrated circuit (ASIC).

Such a procedure is possible through the use of a cap construction according to the present invention, preferably likewise bonded onto a sensor element using a sealing glass as in the prior art. With the use of such a currently existing capping design, flipping is not possible, because bonding pads are situated in recessed fashion and can be accessed only through openings, and/or no separate filling of vias is possible.

On the basis of FIGS. 1 through 7, in the following a manufacturing method according to the present invention of a capping wafer 100 according to the present invention is explained in more detail, in which at least one cap 10 is formed, shown in a cross-sectional view in the respective Figure. Preferably, however, such a capping wafer 100 has a large number of caps 10.

Capping wafer 100 is provided, before a bonding process, with electrical through-connections from a front side 101 to a rear side 102, a complete processing, i.e. production of capping wafer 100, being completely concluded before the actual bonding process. For problem-free functioning of cap 10 resulting from capping wafer 100, it is necessary for the through-connections to be electrically insulated from one another and from a substrate of capping wafer 100. In the method according to the present invention, this is ensured by the fact that inner walls 112 of contacting vias 110, as well as front side 101 and rear side 102 of capping wafer 100, are coated with an electrical insulating layer 103, 106, 111, preferably made of silicon dioxide 52. An actual electrical through-connection of capping wafer 100 is then an electrically conductive material 51, e.g. deposited in an electroplating process, such as a metal 51, preferably gold 51.

A production method for capping wafer 100 may proceed as follows. Referring to FIG. 1, the method begins on rear side 102 of capping wafer 100, with a deposition or thermal growth of electrical insulating layer 106, which is preferably made of silicon oxide 52. In the case of a thermal growth of oxide, capping wafer 100 can advantageously even be provided with oxide layer 52 on front side 101 and on rear side 102 simultaneously; see also FIG. 2. In this way, the later deposition of electrical insulating layer 103 on front side 101 of capping wafer 100 can be omitted (see below). Like the following electrical insulating layer 111 (see FIG. 5), preferably also made of silicon oxide 52, these insulating layers 103, 106 are intended to ensure the electrical insulation of electrical contacts 131, 132, 133, or of electrical contact pins 130, of capping wafer 100 (see also FIGS. 9 and 10).

Subsequently, on rear side 102 a metal 53, in particular copper 53, is sputtered on or is applied in some other way over a large surface as a starting layer for an electroplating method; this is also shown in FIG. 1. For the case of sputtering on of copper 53, it is preferable that the copper adhere to the silicon oxide 52 with an bonding layer, e.g. made of Cr, WTi, etc.

Figure 2:
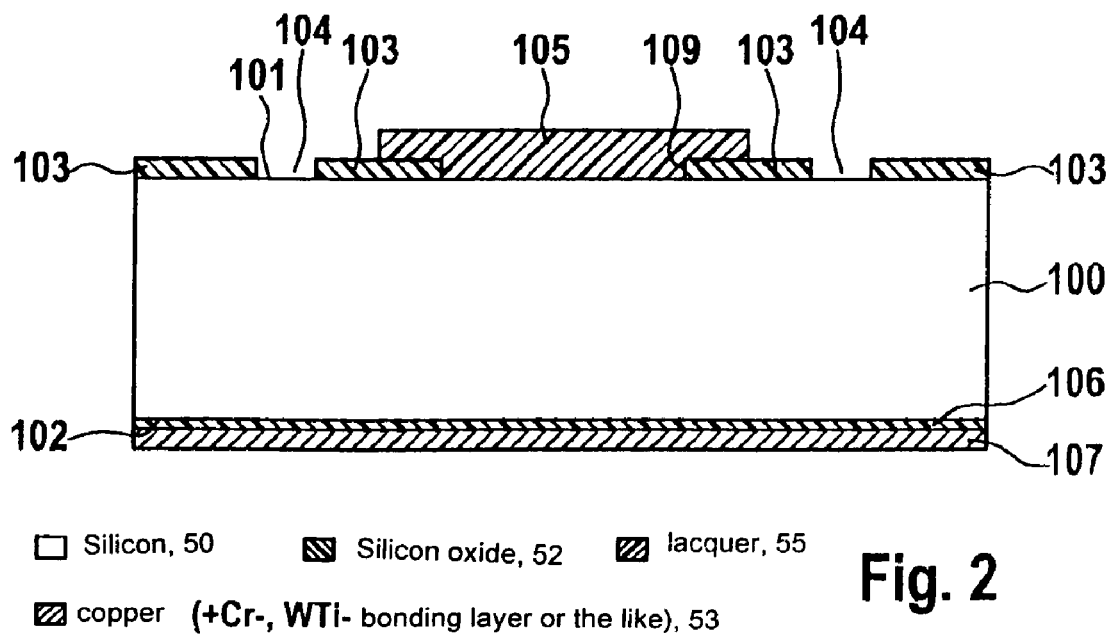
Figure 3:
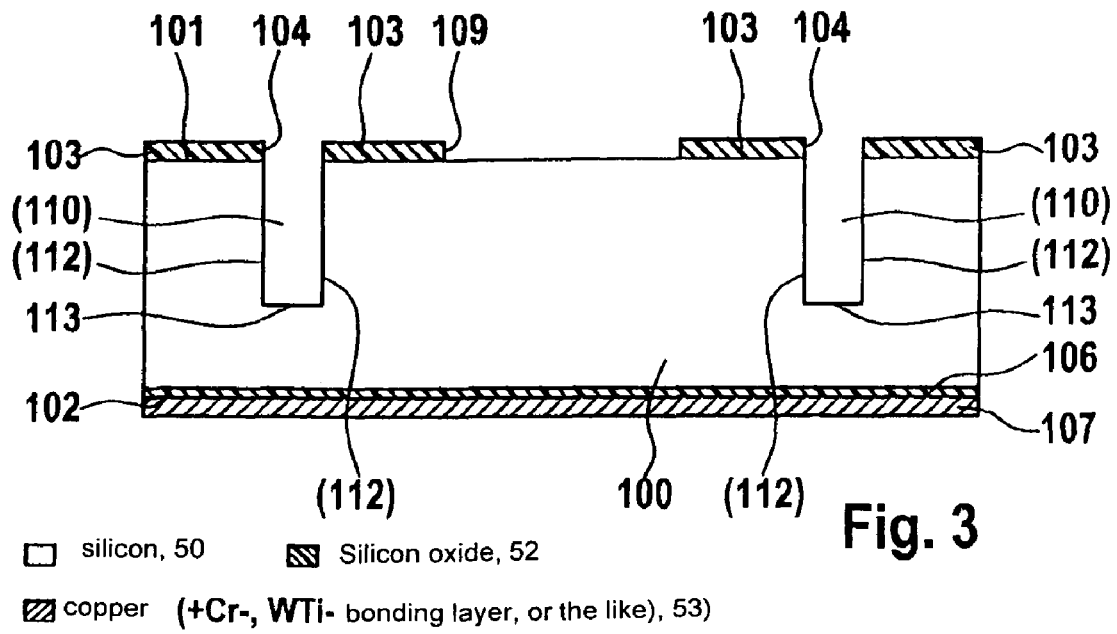
Figure 4:
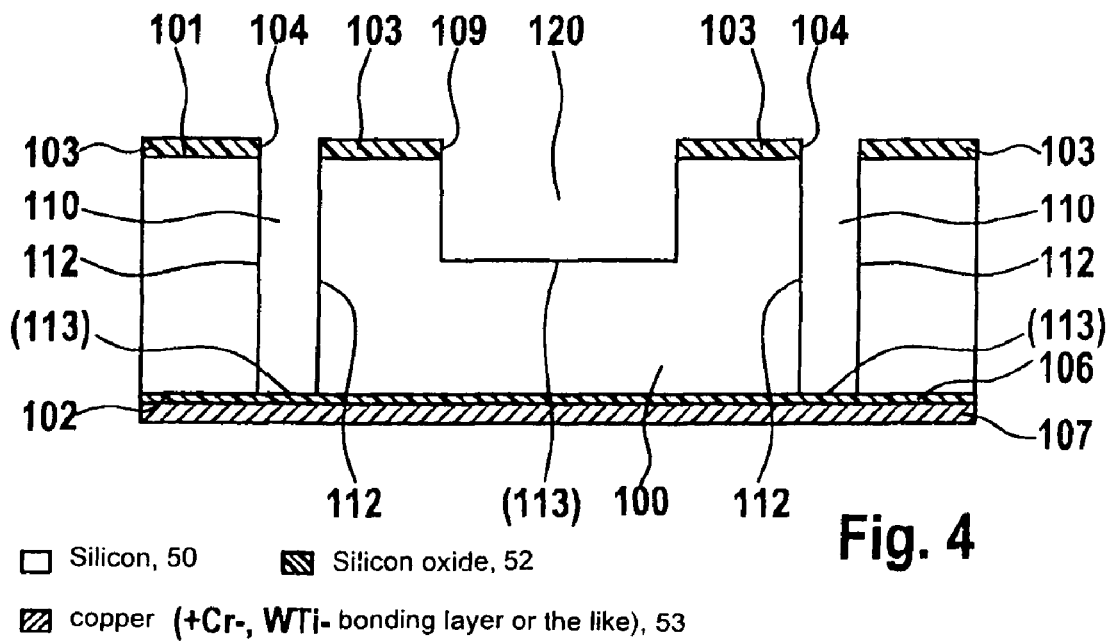
Figure 5:
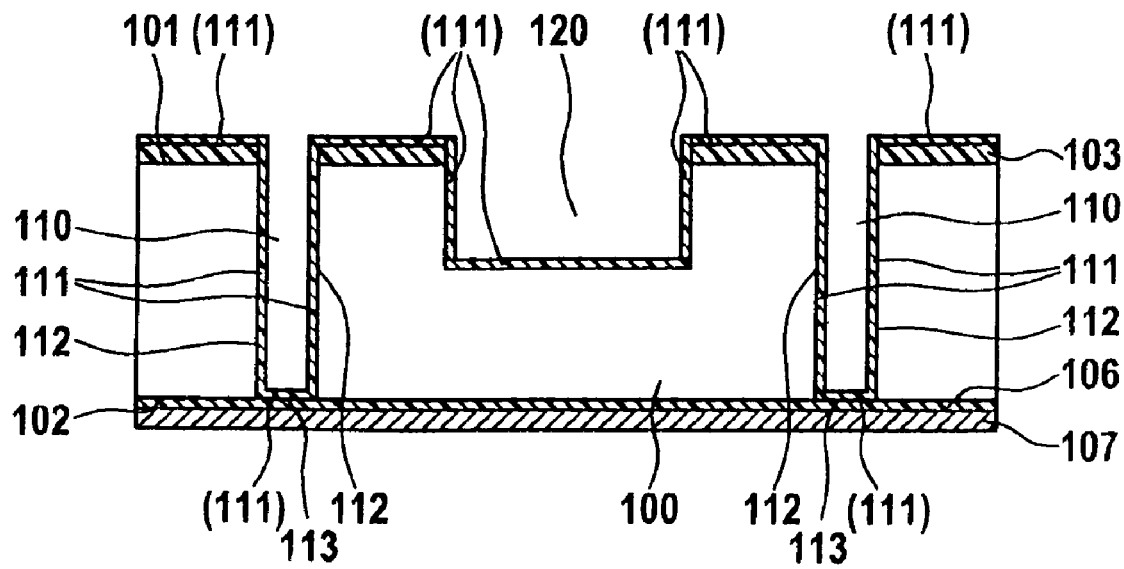
Figure 6:
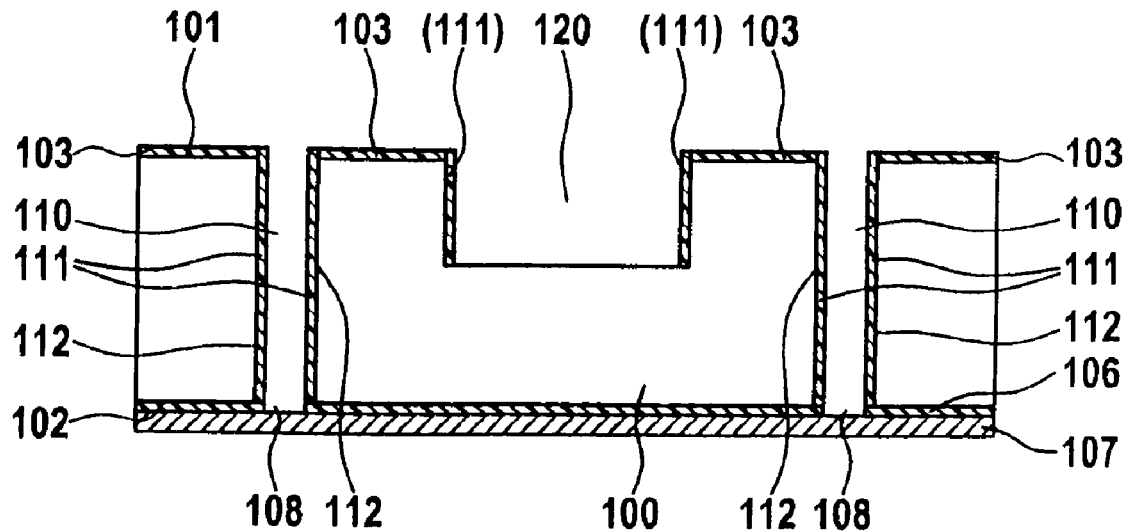

On front side 101 of capping wafer 100, a mask is required for a deep trench process (see FIG. 2), which makes it possible, preferably without a new lithography, to carry out two trench processes having different depths, as is shown in FIGS. 3 and 4. Such a trench process is for example a deep-structuring method such as a trench etching. The first trench process is required in order to produce caverns 120; the second is required in order to etch contacting vias 110 through capping wafer 100. In the following, contacting vias 110 are referred to only as vias 110. Caverns 120 are required for sensor devices 220 (see FIGS. 9 through 11) of sensors 2 that later result, in order to better enable the setting of an internal pressure inside the relevant sensor 2. Caverns 120 may be omitted in certain sensors 2.

For sensors 2 having caverns 120, a hard mask 103 or trench mask 103 is produced, as is shown in FIG. 2. This takes place for example by deposition of an oxide 52 on front side 101 of capping wafer 100, or by using a thermal oxidation of rear side 102 of capping wafer 100, this thermal oxidation simultaneously producing oxide 52 required for mask 103 on front side 101 as well (see above). There subsequently takes place a lithographic and etching-based structuring of mask 103, whereby mask 103 receives both sorts of etching openings 104, 109. Here, etching openings 104 provided as through-openings 104 in mask 103 are provided for the trenching of vias 110, and through-openings 109 are provided as etching openings 109 for the trenching of caverns 120.

Through-openings 109 of a sort provided for the trenching of caverns 120 are covered with a lacquer mask 105, a so-called photoresist 105; this can be accomplished by applying a photoresist 55 and subsequent (photo-)lithography. After the mentioned lithography step, through-openings 104 of the other sort, provided for the trenching of vias 110, are again free of photoresist 55 and oxide 52.

After the first trench process, only vias 110 are etched, because through-openings 104 are covered neither with photoresist 55 nor with oxide 52. Subsequently, photoresist 55 situated on through-openings 109 is removed (see FIG. 3), and the trench process is subsequently continued, which is shown in FIG. 4. Here, caverns 120 and a continuation of vias 110 are etched. A difference in the etching depths of caverns 120 and vias 110 can be controlled via the time of removal of photoresist 55. The trench for the electrical through-connection of capping wafer 100 is stopped on the rear-side oxide. Here, overetching without damage is possible, and caverns 120 can then be etched further down to a desired target depth. To this extent, it is also possible first to completely finish producing vias 110, then subsequently to remove photoresist 55, and only then to produce caverns 120 in capping wafer 100.

If vias 110 and caverns 120 are provided in capping wafer 100, a conformal oxide deposition process is preferably required, which coats inner walls 112 of vias 110. TEOS ozone deposition is well-suited for this purpose. Here, electrical insulating layer 111 shown in FIG. 5 results, which is also referred to as a side wall passivation of vias 110. Before the subsequent electroplating shown in FIG. 7, oxide 52, preferably silicon dioxide 52, on trench floors 113 of vias 110 still has to be removed down to metal 53, or down to the bonding layer (CR, WTi, etc.) of copper 53, preferably using an anisotropic etching process, which layer can then likewise be selectively worn away down to metal 53. The latter can be accomplished using wet etching solutions that selectively etch Cr or WTi relative to copper 53.

Figure 7:
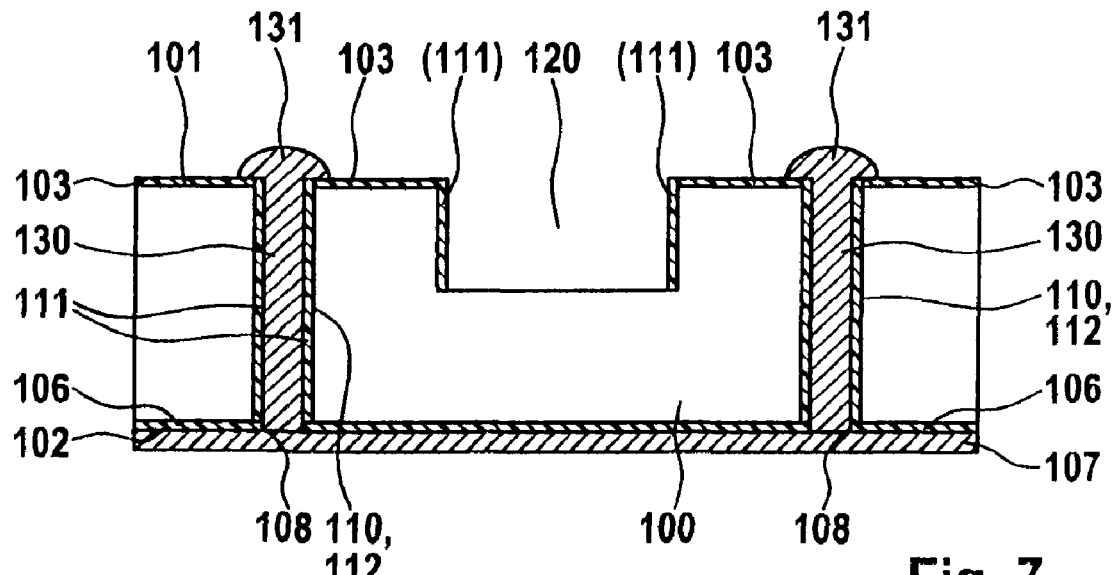

The electroplating process is now started in vias 110 using copper 53 as the plating base; through this process, vias 110 are filled with an electrically conductive material 51, preferably gold 51, beginning on copper layer 107 up to front side 101 of capping wafer 100. If the electroplating process is controlled in such a way that after the filling of vias 110 there is an overgrowth of gold 51 on front side 101 and at the sides, stops 131, preferably hemispherical in shape, are obtained, which, in a subsequent bonding process, are placed on bonding pads 231 of a sensor wafer 200 (see FIGS. 9 through 11) in order in this way to produce electrical contacts that are fashioned for example in the form of electrical press contacts or pressure contacts. For good electrical contacts, and in order to prevent later corrosion, bonding beds 231 of sensor 2 or of the ASIC are likewise coated with gold 51 or are made of gold 51, so that gold 51 on gold 51 contacts result. The end of the electroplating process is shown in FIG. 7.

Figure 8:
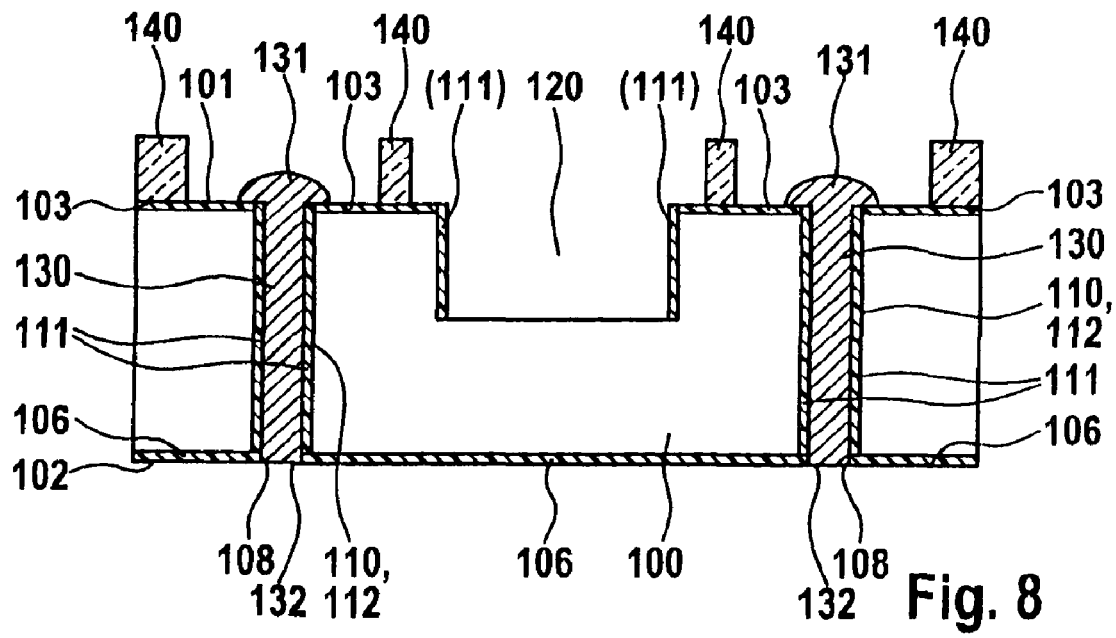

Before an application of sealing glass 54 onto capping wafer 100 prepared in this way, and the execution of a bonding process between capping wafer 100 and sensor wafer 200, on the rear side of capping wafer 100 electrically conductive layer 107 still has to be removed selectively to gold 51 and electrical insulating layer 106 (see FIG. 8). Sealing glass 54 is applied onto capping wafer 100 in the form of sealing glass lips 140 or sealing glass frame 140. According to the present invention, it is also possible to apply sealing glass lips 140 or sealing glass frame 140 onto sensor wafer 200. In the depicted exemplary embodiment of the present invention, the respective caverns 120 with the relevant sensor devices 220 are separately encapsulated relative to the relevant electrical vias as well, two circumferential sealing glass frames 140 being provided for each resulting sensor 2. However, it is also possible according to the present invention to provide only one of these two sealing glass frames 140. It is not necessary according to the present invention to seal sensor device 220 in fluid-tight fashion. Thus, it is possible to configure sealing glass frame 140 to be open, and to provide corresponding sealing glass lips 140 only at suitable locations.

Sealing glass 54 is preferably applied onto capping wafer 100 using a screen printing method. Alternatively to a screen printing method, sealing glass strips 140 can also be provided using stencil printing or some other coating process. In addition, instead of sealing glass 52 other materials may also be used that are capable of bonding two wafers 100, 200 to one another, preferably in gas-tight fashion; for example, this can take place using adhesives, thermoplasts, or other plastics or solders.

Subsequently, capping wafer 100 is bonded onto sensor wafer 200, and a sensor stack 1 according to the present invention is obtained, shown in FIG. 9. Here, electrical stop contacts 131 of contact pins 130 of the through-connection of capping wafer 100 contact electrical terminals 231 of sensor wafer 200.

Figure 11:
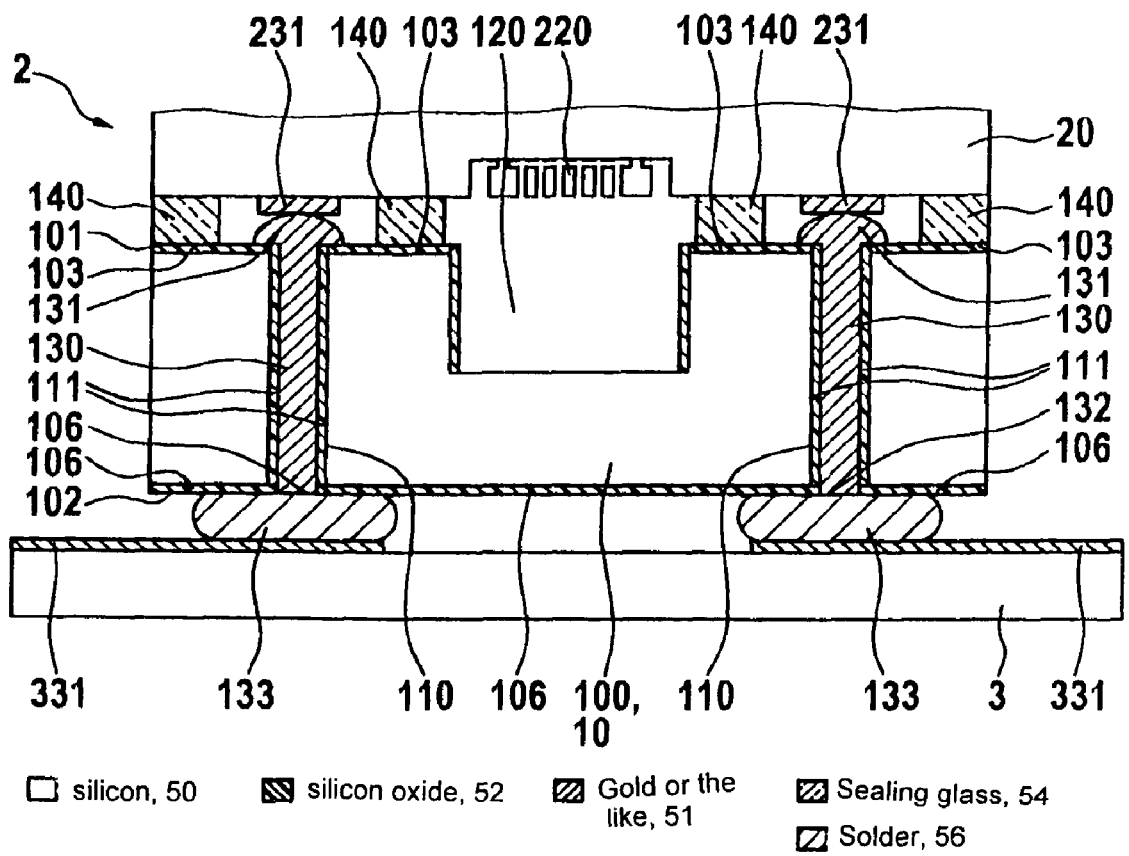
FIG. 11 shows the sensor according to the present invention provided on a substrate.

After the bonding process, sensor stack 1 is ready for separation; in order to be capable of being soldered, individual sensors 2 must be provided with solder bumps 133. This can also take place before the separation of sensor stack 1. Solder bumps 133 are placed directly onto electrical contacts 132, situated on rear side 102 of sensor 2 or of sensor stack 2, of contact pins 130. That is, in example embodiments of the present invention solder bumps 133 are placed directly onto gold 51 of electrical contact pins 130, and can be made for example of a lead-free AgSnCu solder 56. Of course, other solder materials 56 may also be used. Alternatively, solder bumps 133 may also be placed onto a substrate 3, in particular a circuit board 3 or a ceramic 3 onto which an individual sensor 2 is to be soldered. Sensor 2 soldered to substrate 3 is shown in FIG. 11.

If the electrical through-connection is too small in a diameter, and/or a wetting with solder bumps 133 is difficult, then a structured, electrically conductive layer, in particular a gold layer 51, which determines wetting surfaces for solder 56, can be applied, directly at the beginning of the method according to the present invention, on rear side 102 of capping wafer 100 under copper 52, i.e. between electrically conductive layer 107 and electrically insulating layer 106. This results in an enlarged contact surface of solder bumps 133 with electrical contact pins 130. In addition, this step can be used to move the position of electrical contacts 133, i.e. of solder bumps 133, as it were to "rewire" them, or to define sawing lines and/or alignment marks for sensor stack 1.

The present invention is applicable to all sensors 2, in particular motor vehicle sensors 2. In particular, the present invention is applicable to all monolithically integrated sensors 2 that in addition also require a preferably hermetically sealed cap 10. These are in particular (surface) microelectromechanical sensors 2, inertial sensors 2 for measuring accelerations and/or rates of rotation, such as rotational rate sensors 2 or acceleration sensors 2, and also resonators 2.

What is claimed is:

1. A method for producing a sealing glass capping wafer for a sensor having at least one cap, comprising:
   applying an electrically insulating layer on at least one of a rear side and a front side of the capping wafer before providing a contacting via;
   after applying the electrically insulating layer and before the providing of the contacting via, applying an electrically conductive layer on the rear side of the capping wafer;
   providing the contacting via extending through the capping wafer; and
   subsequent to the providing of the contacting via, filling the contacting via with an electrically conductive material.

2. The method as recited in claim 1, further comprising:
   providing, with an electrical insulating layer, an inner wall of the contacting via before the filling of the contacting via; and
   after providing the inner wall of the contacting via, opening the electrical insulating layer on the rear side of the capping wafer in a region of the contacting via to the electrically conductive layer on the rear side of the capping wafer.

3. The method as recited in claim 1, wherein the contacting via is filled using an electroplating method lasting until an electrical stop contact is formed on the front side of the capping wafer, and wherein the electrically conductive material for the electroplating method includes one of gold or a gold alloy.

4. The method as recited in claim 1, further comprising:
   applying a sealing glass lip onto the front side of the capping wafer after the filling of the contacting via.

5. A method for producing a sensor stack having at least one sensor, comprising:
   providing a capping wafer;
   applying an electrically insulating layer on at least one of a rear side and a front side of the capping wafer before providing a contacting via;
   after applying the electrically insulating layer and before the providing of the contacting via, applying an electrically conductive layer on the rear side of the capping wafer;
   providing the contacting via extending through the capping wafer;
   subsequent to the providing of the contacting via, filling the contacting via with an electrically conductive material; and
   bonding the capping wafer to a sensor wafer.

6. The method as recited in claim 5, wherein an electrical contacting of the sensor wafer takes place through the capping wafer, directly via an electrical stop contact of an electrical contact pin of the capping wafer and an electrical terminal of the sensor wafer, and wherein the electrical contact between the electrical stop contact of the capping wafer and the electrical terminal of the sensor wafer is formed by one of an electrical press contact or pressure contact.

* * * * *